United States Patent [19]

Tanei et al.

[11] Patent Number: 5,503,787
[45] Date of Patent: Apr. 2, 1996

[54] METHOD FOR MANUFACTURING MULTILAYER CERAMIC SUBSTRATE

[75] Inventors: Hirayoshi Tanei; Shoichi Iwanaga, both of Yokohama; Shousaku Ishihara, Chigasaki; Kousaku Morita, Zama, all of Japan

[73] Assignee: Hitachi, Ltd., Tokyo, Japan

[21] Appl. No.: 207,620

[22] Filed: Mar. 9, 1994

[30] Foreign Application Priority Data

Mar. 11, 1993 [JP] Japan ................................. 5-050672

[51] Int. Cl.$^6$ .................................................. C04B 35/64
[52] U.S. Cl. ............................. 264/61; 156/89; 264/63; 264/65; 264/66
[58] Field of Search ...................... 156/89; 264/61, 264/65, 66, 63; 419/5, 10, 19

[56] References Cited

U.S. PATENT DOCUMENTS

| | | | |
|---|---|---|---|
| 4,234,367 | 11/1980 | Herron et al. | 156/89 |
| 4,627,160 | 12/1986 | Herron et al. | 29/830 |
| 4,795,512 | 1/1989 | Nakatani et al. | 156/89 |
| 5,073,180 | 12/1991 | Farooq | 65/18.4 |
| 5,147,484 | 9/1992 | Chance et al. | 156/89 |
| 5,230,846 | 7/1993 | Tamhankar et al. | 264/61 |

FOREIGN PATENT DOCUMENTS

| | | |
|---|---|---|
| 1-50120 | 10/1989 | Japan . |
| 2-49550 | 10/1990 | Japan . |

OTHER PUBLICATIONS

Marks' Standard Handbook for Mechanical Engineers, Sixth Edition 1978.
IEEE Transactions on Components, Hybrids and Manufacturing Technology, vol. 14, No. 4, Dec. 1991, "Cosintering Process for Glass-Ceramic Copper Multilayer Ceramic Substrate", R. Master et al, pp. 780–783.
Proceedings 1988 IEEE European IEMT Electronic Manufacturing Technology Symposium, pp. 10–13. "Multilayer Ceramic Circuit Boards W/Copper Conductors".

*Primary Examiner*—Christopher A. Fiorilla
*Attorney, Agent, or Firm*—Fay, Sharpe, Beall, Fagan, Minnich & McKee

[57] ABSTRACT

According to this method for manufacturing a multilayer glass-ceramic circuit board, a green sheet laminate is fired in a non-oxidizing atmosphere in a first firing step so that a void content of at least 10% is maintained and strength of the ceramic laminate is increased. Then the laminate is fired in an oxidizing atmosphere in a second firing step so that the organic binder contained in the laminate is removed and the residual carbon content is at most 200 ppm. Thereafter the laminate is fired in a reducing atmosphere in a third firing step to reduce the oxidized conductor circuit. Finally, the laminate is fired in a non-oxidizing atmosphere in a fourth firing step to densify the ceramic laminate. The firing temperature in the first, second and third steps is 100°–200° C. lower than the softening point of the glass and the firing temperature in the fourth step is higher than the softening point of the glass and lower than the melting point of the conductor.

14 Claims, 2 Drawing Sheets

METHOD FOR MANUFACTURING MULTILAYER CERAMIC SUBSTRATE

BACKGROUND OF THE INVENTION

1. Field of the Invention

The present invention relates to a method for manufacturing of multilayer ceramic substrates used for circuit boards in electronic computers, electronic devices such as electronic exchangers and the like In particular, the present invention relates to a method for manufacturing of multilayer ceramic substrates and for manufacturing of multilayer glass.ceramic substrates by sintering green sheet laminates prepared using organic binders and conductor materials of low melting point such as copper.

2. Description of Related Art

Hitherto, multilayer ceramic substrates have been produced using mainly alumina as an insulating material and molybdenum or tungsten as a conductor material which is a high-melting point metal capable of being sintered together with alumina. However, these conductor materials suffer from the problems that they are high in electric resistance and furthermore, a high firing temperature of about 1600° C. is required for manufacture of the ceramic substrates, consuming a large quantity of energy.

Under the circumstances, there has been proposed a method for manufacturing multilayer ceramic substrates which uses copper having a relatively low melting point and a low electric resistance as a conductor material and glass-.ceramics having a firing temperature of lower than 1000° C. as a material for ceramic substrates (JP 1-50120B). According to this method, green sheets are fired for a long time in an atmosphere where the binder contained in the green sheets is oxidized, but copper is not oxidized, for example, an atmosphere where concentrations of steam, nitrogen gas and hydrogen gas are severely controlled. Moreover, depolymerization type resins are used as the organic binders used for preparing green sheets so that the binders can be easily removed by the firing in the above-mentioned atmosphere.

As related techniques, mention may be made of JP 1-50120B and JP 2-49550B.

In the manufacture of multilayer ceramic substrates, via-holes for electric connection between the upper and lower layers are made through green sheets and in addition, conductor circuit patterns are printed on the green sheets. Therefore, good punchability of via-holes; high positional accuracy in punching of via-holes and small deformation of green sheet after printing of the conductor are all necessary characteristics in manufacture of multilayer ceramic substrates. Furthermore, from the point of hygienic safety of the environment, the binders used with water as a solvent are preferable to the binders used with organic solvents. Thus, such firing processes being able to freely select the binders irrespective of the atmosphere is advantageous as compared with the above-mentioned conventional firing method carried out in the specific atmospheres.

Further, it is advantageous for improvement of productivity that the firing atmosphere does not need severe control and the binder can be removed in a short time. However, the conventional firing for removal of binder requires, for example, about 100 hours at about 800° C. in a non-oxidizing atmosphere, namely, a firing time of 4–5 days for removal of binder in order to reduce the residual carbon content to 200 ppm or lower. Thus, improvement in this respect has been demanded.

SUMMARY OF THE INVENTION

The object of the present invention is to provide a method for manufacturing multilayer ceramic substrates using a conductor material of relatively low melting point and of small-electric resistance such as copper, according to which the binders are not limited to specific ones by the atmosphere for removal of the binder and the most suitable binders for making multilayer ceramic substrates can be selected. Furthermore, the time required for removing binders can be shortened and improvement of productivity can be attained.

DETAILED DESCRIPTION OF PREFERRED EMBODIMENTS

Figure 1:
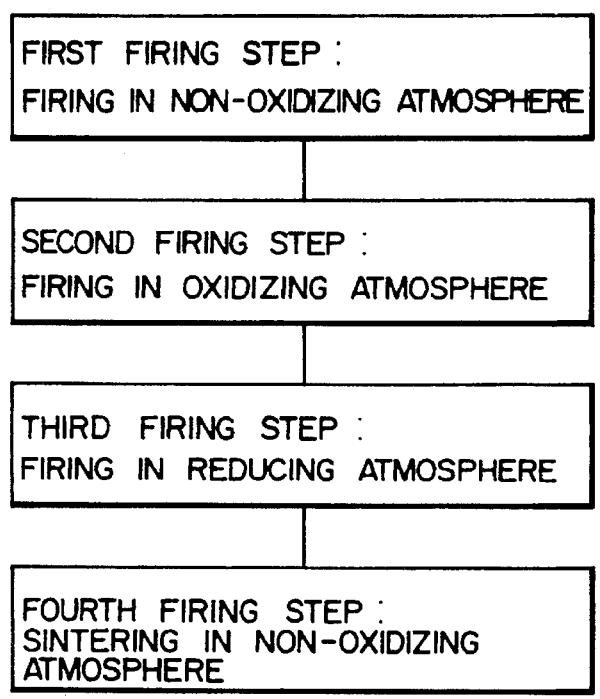
FIG. 1 is a flow chart which shows the firing steps of the present invention.

The inventors have conducted various experiments for attaining the above object to obtain the following effective results.

That is, the present invention provides a method for manufacturing multilayer ceramic substrates which includes a first step of firing a laminate of green sheets of glass.ceramic containing an organic binder and having a conductor circuit pattern on the surface and in via-holes in a non-oxidizing atmosphere, for example, in a nitrogen gas atmosphere under such firing conditions that a bending strength of the laminate of at least 7 MPa, preferably at least 15 MPa can be obtained and void content of the laminate is not less than 10%. The method includes a second step of carrying out the removal of the organic binder contained in the laminate of glass.ceramic green sheets in an oxidizing atmosphere of at least 0.2% in oxygen concentration (which may be 100%), practically preferably in the air. A third step involves firing the laminate in a reducing atmosphere such as hydrogen to reduce the conductor which has been oxidized by the firing in the oxidizing atmosphere for the removal of binder, finally, the method includes a fourth step of heating the laminate up to the temperature at which the laminate is densified in an atmosphere where the reduced conductor is not reoxidized and maintaining the laminate for a while at that temperature to sinter the laminate.

The glass.ceramic laminate obtained by the firing is a dispersion of a glass component in a ceramic component (filler). The green sheet which is a precursor for the glass-.ceramic laminate comprises a ceramic component (filler) such as alumina, cordierite, fused silica glass or the like, a glass component and an organic binder and the customary green sheets can be used. The green sheet is prepared by known processes, namely, by mixing a ceramic component (filler component), a glass component and an organic binder to prepare a slurry, molding the resulting slurry in the form of a sheet, removing the solvent and drying the sheet.

A borosilicate type glass is used as the glass component. Borosilicate glass is especially preferred because it has a thermal expansion coefficient close to that of semiconductor integrated circuit boards. For example, glasses such as lead borosilicate and alkaline earth metal borosilicates are used. The organic binder comprises a resin component such as polyvinyl butyral, an acrylic resin or a mixture of a hydrophilic resin therewith. The hydrophilic resin may be such commercially available one as used for water paints. The solvent may be an organic solvent such as methyl ethyl ketone, methanol or water.

As the circuit conductor, there may be used metals of relatively low melting point such as copper, nickel, aluminum and alloys thereof. The "metals of relatively low melting point" here means metals of lower melting point as compared with metals of high melting points such as molybdenum and tungsten. The formation of the circuit conductor on the green sheet is carried out by known methods such as printing of conductive paste in which fine powders of the above metals are dispersed.

The firing steps of the green sheet laminate of the present invention will now be explained in detail.

(1) The firing in a non-oxidizing atmosphere in the first firing step has an action to increase the strength of ceramic laminate with keeping a specific void content. The non-oxidizing atmosphere includes an inert gas atmosphere such as nitrogen, argon or the like and a reducing gas atmosphere such as hydrogen or the like. By this firing, a part of the organic binder contained in the ceramic laminate is removed, but the laminate is generally half-fired and has a blackish gray color. A higher firing temperature is preferred for increasing the strength of the ceramic laminate. However, if the firing temperature is too high and isolated voids are produced in the ceramic laminate, the binder present in the ceramic laminate cannot escape at the subsequent step. Therefore, the firing temperature must be one at which isolated voids are not almost produced in the ceramic laminate.

The firing temperature is preferably low so that the total void content in the ceramic laminate is not less than 10%. As the material for multilayer ceramic substrates sintered simultaneously with the conductor such as copper, there may be used glass, crystallized glass or mixtures of these glass components with fillers. Therefore, the firing temperature of the first firing step is between the softening point of the glass contained in the ceramic laminate and a temperature of 100°–200° C. lower than the softening point.

(2) The second firing step is a firing in an oxidizing atmosphere and has an action to burn and remove in a short time the organic binder present in the green sheets. If the removal of the organic binder is insufficient and carbon remains in the ceramic substrate, insulation resistance of the ceramic laminate decreases and furthermore, dielectric constant increases. Thus, the laminate is unsuitable as a circuit board. Therefore, it is necessary to fire the laminate in such a manner that the amount of carbon remaining in the ceramic laminate is at most 200 ppm.

Accordingly, the atmosphere in which the organic binder is burnt may be an atmosphere comprising 100% of oxygen and practically most preferred is an air atmosphere having an oxygen concentration of 21%. However, the binder can be burnt out when oxygen concentration is at least 0.2%.

The firing temperature is suitably from about 400° C. which is the decomposition temperature of the organic binder to the softening point of the glass contained in the ceramic laminate. When the firing is carried out at a temperature higher than the above range, sintering of glass particles is accelerated and isolated voids are apt to be produced inside the ceramic laminate, and as a result, burning of the organic binder stops and sufficient removal of the organic binder becomes difficult.

On the other hand, the firing in an oxidizing atmosphere causes expansion of the conductor material due to the oxidation. Therefore, if the second firing in the oxidizing atmosphere is directly carried out without carrying out the first firing in the non-oxidizing atmosphere, the multilayer ceramic substrate obtained has cracks in the ceramic laminate near the circuit conductor. In particularly, circumferential and radial cracks appear conspicuously in the ceramic laminate around the via-hole conductor. No cracks occur in the multilayer ceramic substrate subjected to the first firing in the non-oxidizing atmosphere and thereafter to the second firing in the oxidizing atmosphere. That is, the first firing in the non-oxidizing atmosphere has an additional action to inhibit generation of cracks around the circuit conductor during the second firing in the oxidizing atmosphere.

(3) The third firing step is carried out in a reducing atmosphere and has an action to reduce the conductor material which has been oxidized in the second firing step. As conditions for the firing in the reducing atmosphere, the concentration of reducing gas, the firing temperature and the retention time can be suitably selected. As the reducing gas, hydrogen is representative and other gases such as carbon monoxide can also be used. The concentration of the reducing gas can be at least 0.1%, preferably 4–100%. In the case of hydrogen, about 10% is practically preferable, taking into consideration the danger when it leaks. The firing temperature is from about 400° C. to the softening temperature of the glass contained in the ceramic laminate as in the second firing step and the firing is carried out until the reduction of the oxidized conductor has been completed.

(4) The fourth and final firing step has the action to densify the ceramic laminate by sintering and ensure the strength as a ceramic substrate and thus completes the multilayer ceramic substrate. For this firing, the atmosphere where the reduced conductor is not reoxidized and the conductor resistance does not increase is selected and this is usually a non-oxidizing atmosphere as in the first firing step. The firing temperature is higher than the softening temperature of the glass contained in the ceramic laminate in order to densify the ceramic laminate. The upper limit of the firing temperature is lower than the melting point of the conductor material so that the conductor material should not melt.

The retention time for firing in these four firing steps can be selected depending on the firing temperature in such a manner that the purpose of firing in the respective steps can be attained. That is, for the same glass.ceramic material, relatively long retention time for firing is selected in the case of low firing temperature. A long retention time is not preferred since decrease in productivity is brought about. Thus, the retention time is usually 0.5–6 hours.

As the conductor material for forming via-holes and circuit patterns, copper is practically most preferred. Furthermore, nickel or aluminum or alloys thereof which are lower in price can also be used.

The following examples, with particular reference to the drawings, will be set forth to illustrate the invention.

Example 1

(1) Preparation of green sheet:

100 parts by weight of ceramic powders consisting of 56 wt% of borosilicate glass powders (softening temperature: 824° C., thermal expansion coefficient: $2.3 \times 10^{-6}$/°C.), 24 wt % of alumina powders and 20 wt % of cordierite powders, 14 parts by weight of a water-soluble binder mainly composed of modified acrylic resin, 75 parts by weight of a solvent mainly composed of water and 0.3 part by weight of ammonium acrylate (dispersant) were blended and mixed in a ball mill to prepare a slurry.

The binder used was a commercially available organic binder which provided a high positional accuracy in making holes and which was high in hygienic safety.

Then, a green sheet of 0.2 mm thick and 450 mm wide was prepared by doctor blade method. The green sheet was cut to 200 mm squares or 50 mm squares. Holes (via-holes) of 0.13 mm in diameter were bored through the green sheet of 200 mm squares at a pitch of 0.45 mm by a punch. A copper paste was filled in the holes by screen printing method and furthermore, a circuit pattern was formed on the surface of the green sheet by printing the copper paste in accordance with conventional method. Four to fifty green sheets were stacked and pressed at a temperature of 130° C. and a pressure of 20 MPa for 10 minutes.

Furthermore, samples for measuring strength, void content and residual carbon content were similarly prepared by pressing the green sheets with no holes and no conductor printed. The resulting two kinds of green sheet laminates were cut to 10 mm squares and 60 mm squares to be fired. The resulting laminates were fired in accordance with the flow chart shown in FIG. 1.

(2) Firing steps of the green sheet laminate:

The green sheet laminate was put in a ring electric furnace having a core tube (outer diameter: 120 mm) of silica glass and subjected to firing in a non-oxidizing atmosphere which was the first firing step. The firing was carried out at a temperature of 650°–850° C. for a retention time of 3 hours with flowing 4 liter/min of nitrogen gas.

Figure 2:
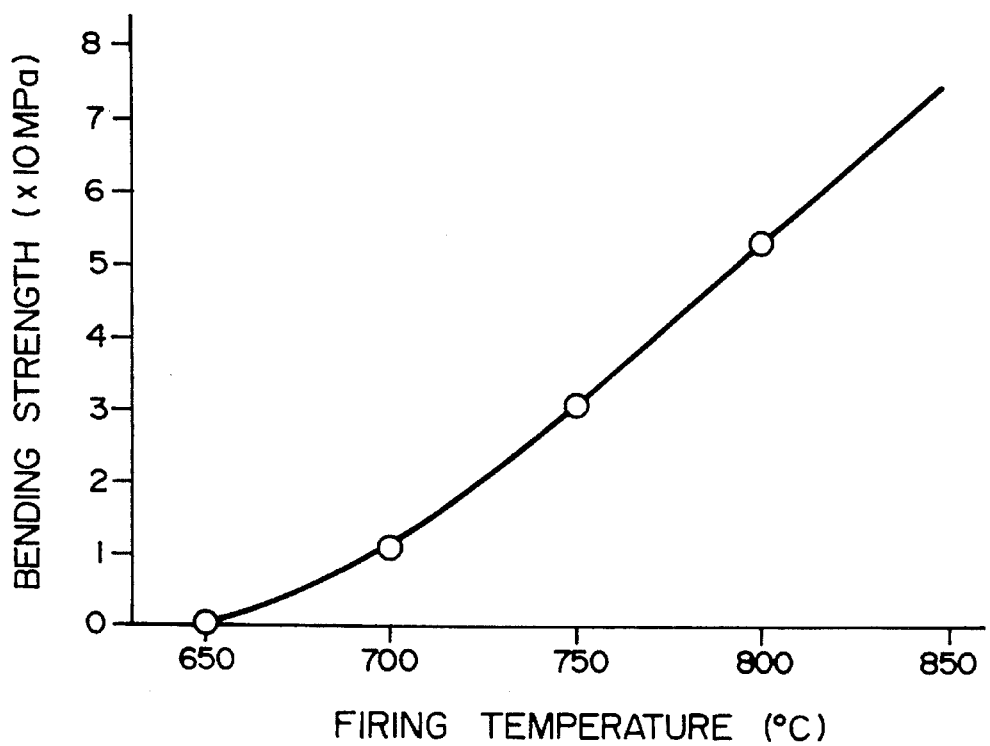
FIG. 2 is a graph which shows the relation between the firing temperature in the first firing step and the bending strength of the ceramic laminate in one example of the present invention.

In this firing step, the laminates cut to 50×4×3 mm were also fired and bending strength of the laminates after the first firing step was measured. The results are shown in FIG. 2. That is, FIG. 2 shows the relation between bending strength and firing temperature in the first firing step. The strength increased in proportion to the temperature and a bending strength of higher than 7 MPa was obtained at the firing temperature of higher than 700° C.

Figure 3:
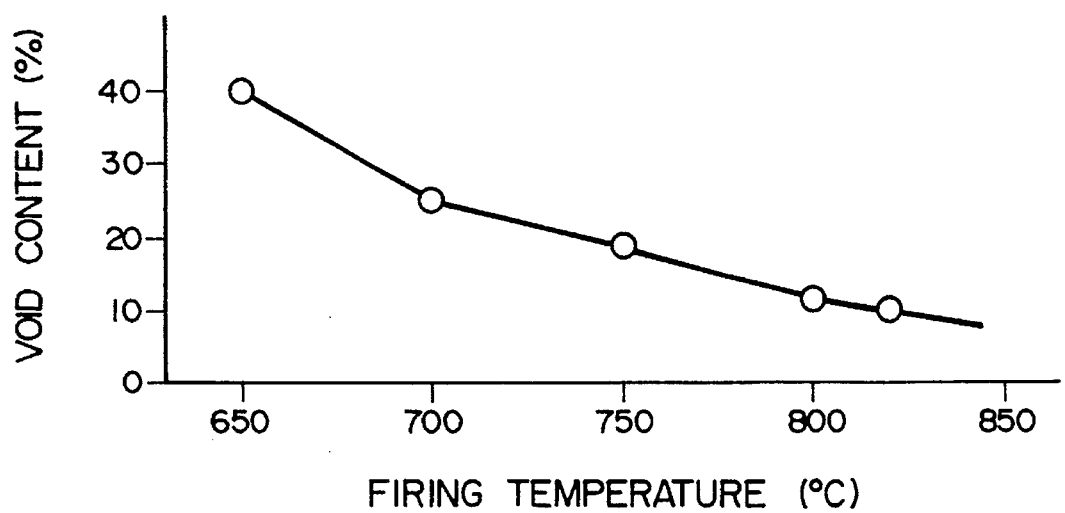
FIG. 3 is a graph which shows the relation between the firing temperature in the first firing step and the void content of the ceramic laminate.

Furthermore, the relation between void content and firing temperature in the first firing step is shown in FIG. 3. As can be seen from FIG. 3, the void content was in inverse proportion to the firing temperature and decreased with rising of the temperature. In the case of this green sheet material, a bending strength of higher than 7 MPa and a void content of more than 10% were obtained at the firing temperature in the range of 700°–820° C.

The void content was obtained by the known method using the following equation (1).

$$\text{Void content} = 1 - \text{density/true density} \tag{1}$$

In the above equation, the density is an actually measured volume density of the fired laminate obtained in the first firing step and the true density is the theoretical density of this glass.ceramic. The density/true density is a relative density.

Figure 4:
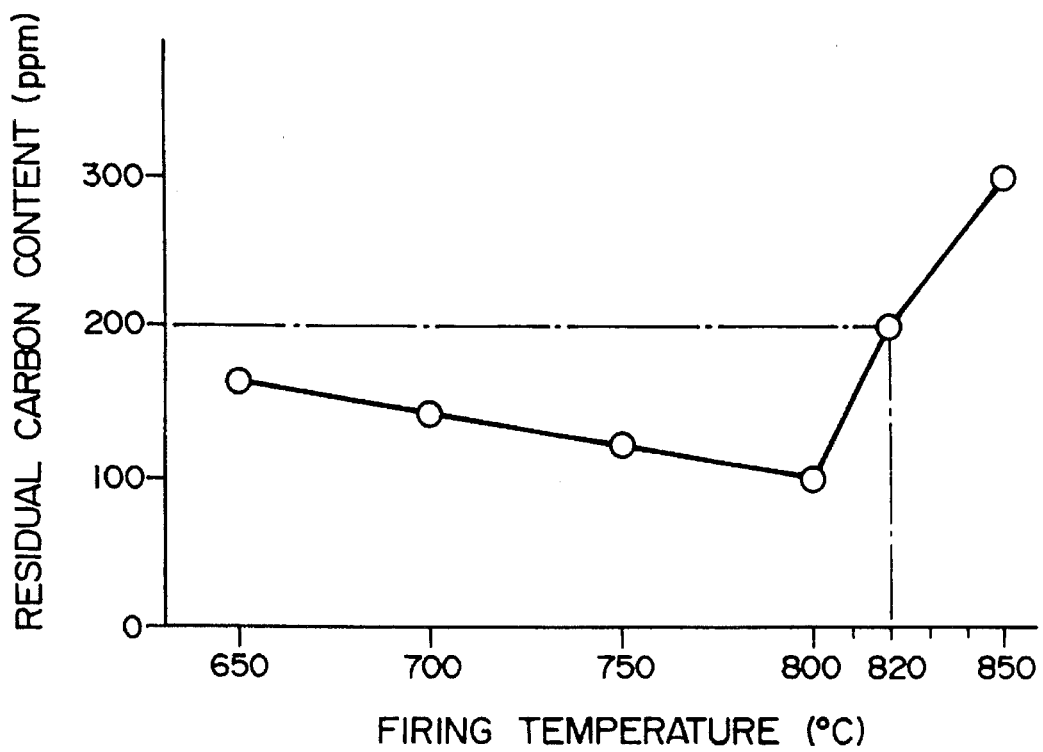
FIG. 4 is a graph which shows the relation between the firing temperature in the first firing step and the residual carbon content in the ceramic laminate after subjected to the second firing step.

Next, the firing in an oxidizing atmosphere which is the second firing step was carried out. The firing was carried out at a temperature of 600° C. for a retention time of 2 hours with flowing 4 liter/min of air. The central portion of the resulting fired laminate (laminate of fifty green sheets of 50 mm square) was scraped out and the amount of carbon contained in the ceramic laminate was analyzed. The results are shown in FIG. 4. The relation between firing temperature in the first firing step and residual carbon content after the second firing is shown in FIG. 4. That is, as can be seen from FIG. 4, when the firing temperature in the first firing step was lower than 820° C., the residual carbon content was smaller than 200 ppm.

As mentioned above, the conventional technique required 100 hours at a firing temperature of about 800° C. for removal of the binder in order to reduce the residual carbon content to 200 ppm or lower while the object could be attained by the firing at 600° C. for 2 hours in this Example.

Next, the relation between occurrence of cracks around the conductor of via-hole after the second firing and firing temperature in the first firing step is shown in Table 1.

TABLE 1

| Firing temperature (°C.) | 650 | 700 | 750 | 800 | 820 |
|---|---|---|---|---|---|
| Cracks | Occurred | Not occurred | Not occurred | Not occurred | Not occurred |

When the firing temperature in the first firing step was 700° C. or higher, no cracks occurred. That is, no cracks occurred around the via-holes when the residual carbon content in the ceramic laminate having copper circuit after subjected to the second firing was at most 200 ppm and the firing temperature in the first firing step was 700°–820° C. When the firing temperature in the first firing step was in the above range, the bending strength of the ceramic laminate was 7 MPa or higher and the void content thereof was 10% or higher.

Next, the sample from which the binder had been removed as above was subjected to firing in a reducing atmosphere which is the third firing step. That is, the sample was put in a box electric furnace (internal size: 200×200× 250 mm) in which firing in various atmospheres can be performed and the firing was carried out at 600° C. for a retention time of 3 hours with flowing 4 liter/min of a nitrogen gas containing 5% of hydrogen. It was found by observation under an optical microscope that the copper conductor portion of the thus fired sample had metallic luster. It was also found that no diffraction peaks of copper oxide appeared in the X-ray diffraction pattern. Thus, it was confirmed that the copper conductor was reduced.

Then, the sample fired in the reducing atmosphere as mentioned above was subjected to the firing in a non-oxidizing atmosphere which is the fourth and final firing step using the above-mentioned box electric furnace. That is, the firing was carried out at 925° C. for a retention time of 2 hours with flowing 4 liter/min of nitrogen gas. The ceramic laminate portion of the thus fired sample had a relative density of 98%, an insulation resistance of at least $1012\Omega.\text{cm}$, a dielectric constant of 5.0 and a bending strength of at least 200 MPa, and the via-hole conductor portion had a specific resistance of 3 $\mu\Omega.\text{cm}$. Thus, the sample. sufficiently satisfied the characteristics necessary for a circuit board. The similar results were obtained when the atmosphere in the fourth firing step was argon or nitrogen containing argon or hydrogen.

Example 2

The procedure of Example 1 was repeated except that the firing in the second firing step was conducted at 600° C. for a retention time of 6 hours with flowing 4 liter/min of nitrogen gas containing 0.2% of oxygen. The sample used was the one which was fired at 750° C. in the first firing step. The sample which had been subjected to the second firing step had a void content of 20% and a residual carbon content of 125 ppm which sufficiently satisfied the condition, "at most 200 ppm". The results were satisfactory.

In the above Examples, the glass.ceramic component of the green sheet to be fired was composed of borosilicate glass, alumina and cordierite, but similar results are obtained when lead borosilicate glass, an alkaline earth metal borosilicate or the like is used as the glass and mullite, zirconia, forsterite or the like is used as the ceramic. When the softening temperature of the glass used here is higher than that of the glass used in Example 1, the firing is carried out at a temperature higher than the firing temperature employed in Examples 1 and 2 and inversely, when the softening temperature of the glass used is lower, the firing is carried out at lower temperature.

On the other hand, when amount of the filler of the ceramic component added to the glass is larger than the amount of the filler used in Example 1, the firing is carried out at a temperature higher than the firing temperature employed in Examples 1 and 2 or with a retention time longer than that in Examples 1 and 2. When amount of the filler of the ceramic component added to the glass is smaller than the amount of the filler used in Example 1, the firing conditions were reverse to the above conditions.

As explained above, the desired objects can obtained by the manufacturing method of the present invention. That is, the following advantageous effects can be obtained: binders used are not limited by the atmosphere used for removal of the binders and the binders most suitable for making multilayer ceramic substrates can be selected; the time for removal of the binders can be markedly shortened as compared with the conventional methods; and the productivity can be conspicuously improved. Therefore, the method of the present invention contributes largely to industrial development.

What is claimed is:

1. A method for manufacture of a multilayer ceramic substrate which comprises a first step of heat treating a green sheet laminate, having a glass component and a ceramic component, containing an organic binder in a non-oxidizing atmosphere including retaining the laminate in the atmosphere for a time sufficient to obtain a void content of at least 10%, thereby to give a strength to obtain a void of at least 7 MPa of the laminate, a second step of heat treating the laminate in an oxidizing atmosphere to remove the organic binder contained in the laminate, a third step of heat treating the laminate in a reducing atmosphere to sufficiently reduce a circuit conductor, which is present in the laminate and is oxidized in the second step, and a fourth step of heat treating the laminate in a non-oxidizing atmosphere at a sufficient temperature and for a sufficient retention time to sinter and density the laminate and wherein the oxidizing atmosphere in the second step contains at least 0.2% of oxygen by volume.

2. A method according to claim 1, wherein the glass component comprises at least one of borosilicate glass, lead borosilicate glass or alkaline earth metal borosilicate glass.

3. A method according to claim 1, wherein the ceramic component comprises at least one of alumina, cordierite, mullite, zirconia or forsterite.

4. A method according to claim 1, wherein the circuit conductor comprises copper, nickel or aluminum or an alloy thereof.

5. A method according to claim 1, wherein the organic binder is polyvinyl butyral, an acrylic resin or a mixture including a hydrophilic resin.

6. A method according to claim 1, wherein the a heat treating temperature in the first step of heat treating is 100°–200° C. lower than a softening temperature of the laminate.

7. A method according to claim 1, wherein the non-oxidizing atmosphere in the first step and the fourth step is an inert gas atmosphere or a reducing gas atmosphere.

8. A method according to claim 1, wherein the firing in the oxidizing atmosphere in the second step is carried out at such a temperature and for such a retention time that a residual carbon content remaining in the laminate can be at most 200 ppm.

9. A method according to claim 1, wherein the firing in the reducing atmosphere in the third step is carried out at such a temperature and for such a time that the circuit conductor oxidized in the second step can be sufficiently reduced to a metal.

10. A method according to claim 1, wherein the reducing atmosphere in the third step contains at least 0.1% of hydrogen.

11. A method according to claim 1, wherein the firing in the non-oxidizing atmosphere in the fourth step is carried out at such a temperature and for such a time that a bending strength of at least 200 MPa is obtained.

12. A method according to claim 1, wherein the firing temperature in the fourth step is higher than a softening temperature of the glass component and lower than a melting temperature of the circuit conductor and the firing temperature in the first, second and third steps is lower than a softening temperature of the glass.

13. A method according to claim 1, wherein the glass component of the laminate is a borosilicate glass and the ceramic component is a mixture of alumina and cordierite, and the non-oxidizing atmosphere in the first step comprises a nitrogen gas stream, the oxidizing atmosphere in the second step comprises an air stream, the reducing atmosphere in the third step comprises a nitrogen stream containing at least 4% of hydrogen, and the non-oxidizing atmosphere in the fourth step comprises a nitrogen gas stream.

14. A method according to claim 13 wherein the firing temperature in the first step is 700°–820° C. and the retention time for the firing is 0.5–6 hours.

\* \* \* \* \*